United States Patent
Chen et al.

(10) Patent No.: US 7,285,377 B2
(45) Date of Patent: Oct. 23, 2007

(54) FABRICATION METHOD FOR A DAMASCENE BIT LINE CONTACT PLUG

(75) Inventors: Yi-Nan Chen, Taipei (TW); Jeng-Ping Lin, Taoyuan (TW); Chih-Ching Lin, Taoyuan (TW); Hui-Min Mao, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 632 days.

(21) Appl. No.: 10/715,616

(22) Filed: Nov. 18, 2003

(65) Prior Publication Data

US 2004/0219462 A1    Nov. 4, 2004

(30) Foreign Application Priority Data

May 1, 2003    (TW) ............................... 92112011 A

(51) Int. Cl.
    *G03F 7/00*    (2006.01)
(52) U.S. Cl. .................. 430/311; 430/312; 430/316
(58) Field of Classification Search .................. None
    See application file for complete search history.

(56) References Cited

U.S. PATENT DOCUMENTS

| 5,663,092 | A | 9/1997 | Lee |
| 6,548,394 | B1 * | 4/2003 | Peng et al. .................. 438/618 |
| 6,713,335 | B2 * | 3/2004 | Yen et al. .................... 438/199 |
| 2004/0092070 | A1 * | 5/2004 | Hsu et al. .................... 438/241 |

* cited by examiner

*Primary Examiner*—John A. McPherson
*Assistant Examiner*—Daborah Chacko-Davis
(74) *Attorney, Agent, or Firm*—Quintero Law Office

(57) ABSTRACT

A fabrication method for a damascene bit line contact plug. A semiconductor substrate has a first gate conductive structure, a second gate conductive structure and a source/drain region formed therebetween. A first conductive layer is formed in a space between the first gate conductive structure and the second gate conductive structure to be electrically connected to the source/drain region. An inter-layer dielectric with a planarized surface is formed to cover the first conductive layer, the first gate conductive structure, and the second gate conductive structure. A bit line contact hole is formed in the inter-layer dielectric to expose the top of the first conductive layer. A second conductive layer is formed in the bit line contact hole, in which the combination of the second conductive layer and the first conductive layer serves as a damascene bit line contact plug.

15 Claims, 15 Drawing Sheets

FABRICATION METHOD FOR A DAMASCENE BIT LINE CONTACT PLUG

BACKGROUND OF THE INVENTION

1. Field of the Invention

The invention relates to a contact process, and more particularly to a fabrication method for a damascene bit line contact plug.

2. Description of the Related Art

The self-aligned contact (SAC) process is a manufacturing method used to fabricate semiconductor devices such trench type DRAM, stacked DRAM, and FLASH memory. The SAC process reduces chip size by shortening the separation between adjacent polysilicon gates. In a conventional SAC process, a sidewall spacer of the gate is used to define a lightly doped drain (LDD) structure, and is also used to extend the oxide region at the gate edge and thereby improve source/drain leakage prevention.

FIGS. 1A to 1G are cross-sections of a conventional SAC process. In FIG. 1A, a gate insulating layer 12 is formed on a P-type silicon substrate 10, and a plurality of gate structures 14 is formed on the gate insulating layer 12. Next, a plurality of N-type ion-doped regions 16 is formed in the substrate 10 and laterally adjacent to the gate structures 14, respectively. Each of the gate structures 14 is a stack of a polysilicon layer 18 and a silicon nitride cap layer 20.

In FIG. 1B, a nitride sidewall spacer 22 is formed on the sidewall of the gate structure 14, and an N-type ion-doped region 24 is then formed on the exposed N-type ion-doped region 16 using the gate structure 14 and the nitride sidewall spacer 22 as the mask. The N-type ion-doped region 24 serves as a source/drain region, and the remaining part of the N-type ion-doped region 16 serves as an LDD structure. Next, a barrier layer 26 of silicon nitride is deposited to cover the entire surface of the substrate 10.

In FIG. 1C, an inter-layer dielectric (ILD) 28 is deposited on the barrier layer 26 to fill the gap between adjacent gate structures 14. Then, in FIG. 1D, a chemical-mechanical polishing (CMP) process is performed to level off the surface of the ILD 28. Next, in FIG. 1E, using a patterned photoresist layer (not shown) as a mask, the ILD 28 positioned between adjacent gate structures 14 is etched with the barrier layer 26 as an etching stop layer, resulting in an opening 29. However, in practical operation, the silicon nitride cap layer 20 and the nitride sidewall spacer 22 are over-etched, thus the profile of the opening 29 is shown as the dotted line.

In FIG. 1F, the barrier layer 26 at the bottom of the opening 29 is removed to expose the $N^+$-type ion-doped region 24 between adjacent gate structures 14 so as to complete a contact hole 30. Next, in FIG. 1G, using deposition, photolithography and etching, the contact hole 30 is filled with a conductive material to serve as a bit line contact plug 32. Subsequently, a gate contact process and a source contact process are performed thereon.

The above-described SAC process, however, has the following disadvantages.

Step height between the active area (AA) and the shallow trench isolation (STI) is problematic as it can cause misalignment during photolithography or CMP and can result in an excessively thick ILD layer 28 with inadequate flatness. Hence, the etched profile of the contact hole 30 is affected, and causes problems in the interconnection structure, such as a short circuit between bit line and wordline or a blind window in the bit line contact hole 30.

The etching selectivity from the ILD layer 28 to the SiN liner 26 is not large enough to provide etching stop capability during the formation of the bit line contact hole 30, and seams will likely form in the STI region causing junction leakage between the bit line contact plug 32 and the substrate 10.

The silicon nitride cap layer 20 must maintain a certain thickness during the SAC process, thus the thermal budget is increased, and electrical properties, such as $V_t$, $I_{dsat}$, $I_{off}$, suffer.

When the SAC process is applied to the manufacture of a device with reduced size, problems encountered during photolithography become more acute.

Finally, the materials used for the cap layer 20 and the spacer 22 are limited to SiN or SiON, which exacerbate leakage in the polysilicon layer 18.

SUMMARY OF THE INVENTION

Accordingly, an object of the present invention is to provide a fabrication method for a damascene bit line contact plug to solve problems caused by the conventional SAC process.

According to the object of the invention, a fabrication method for a damascene bit line contact plug includes the following steps. A semiconductor substrate has a first gate conductive structure, a second gate conductive structure and a source/drain region formed therebetween. A first conductive layer is formed in a space between the first gate conductive structure and the second gate conductive structure to be electrically connected to the source/drain region. An inter-layer dielectric with a planarized surface is formed to cover the first conductive layer, the first gate conductive structure, and the second gate conductive structure. A bit line contact hole is formed in the inter-layer dielectric to expose the top of the first conductive layer. A second conductive layer is formed in the bit line contact hole, in which the combination of the second conductive layer and the first conductive layer serves as a damascene bit line contact plug.

DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

The present invention provides a fabrication method for a damascene bit line contact plug, which is preferably used in a contact process for a line width less than 0.11 μm, and used to manufacture semiconductor devices, such as trench type DRAM, stacked DRAM, and FLASH memory.

FIGS. 2A to 2K are cross-sections of a method of forming a damascene bit line contact plug according the present invention.

Figure 1A:
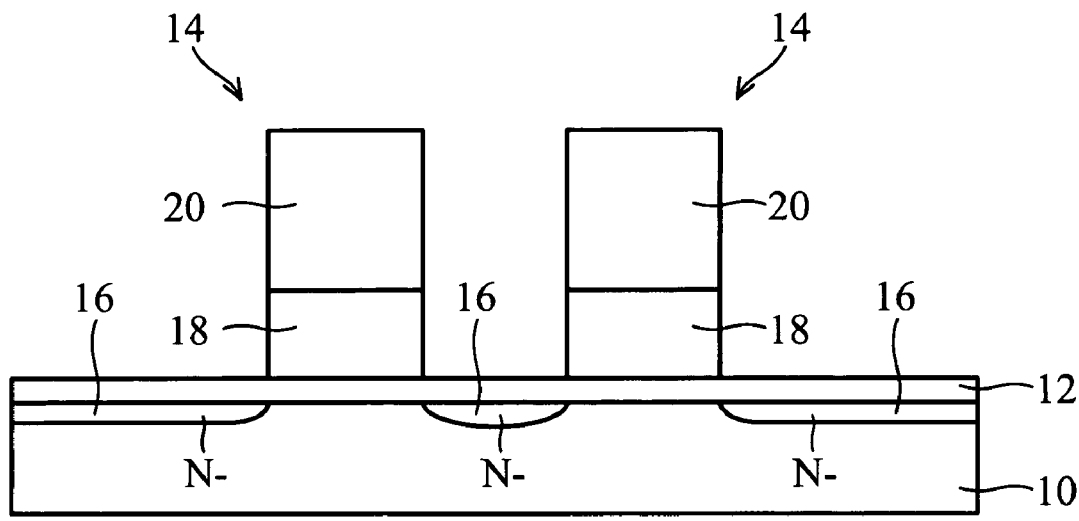
FIGS. 1A to 1G are cross-sections of a conventional SAC process.
Figure 1B:
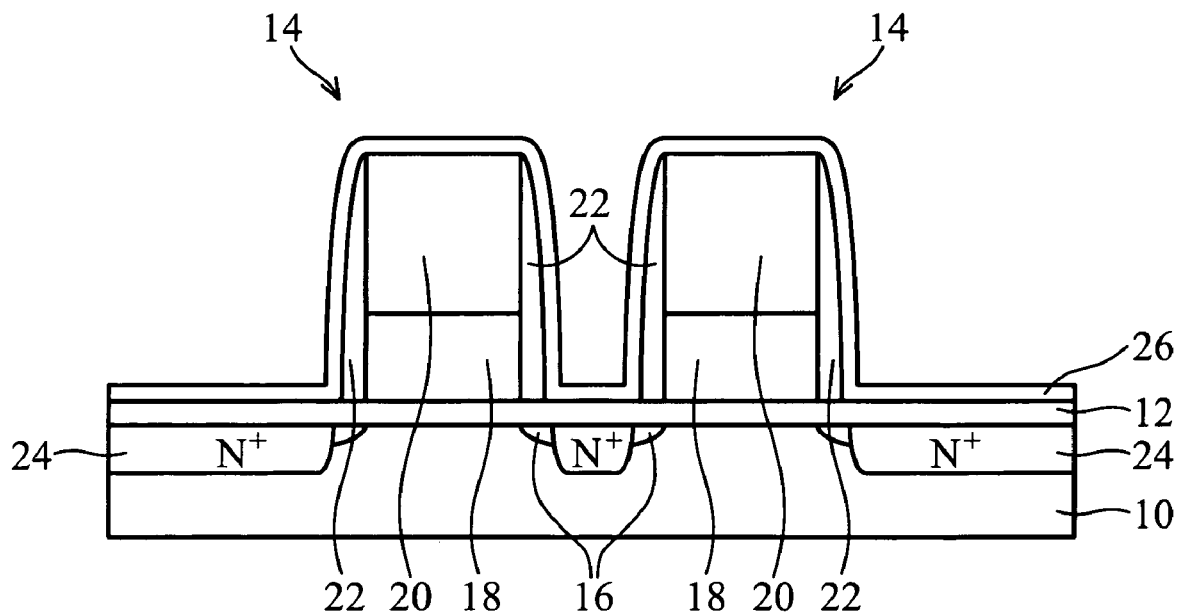
Figure 1C:
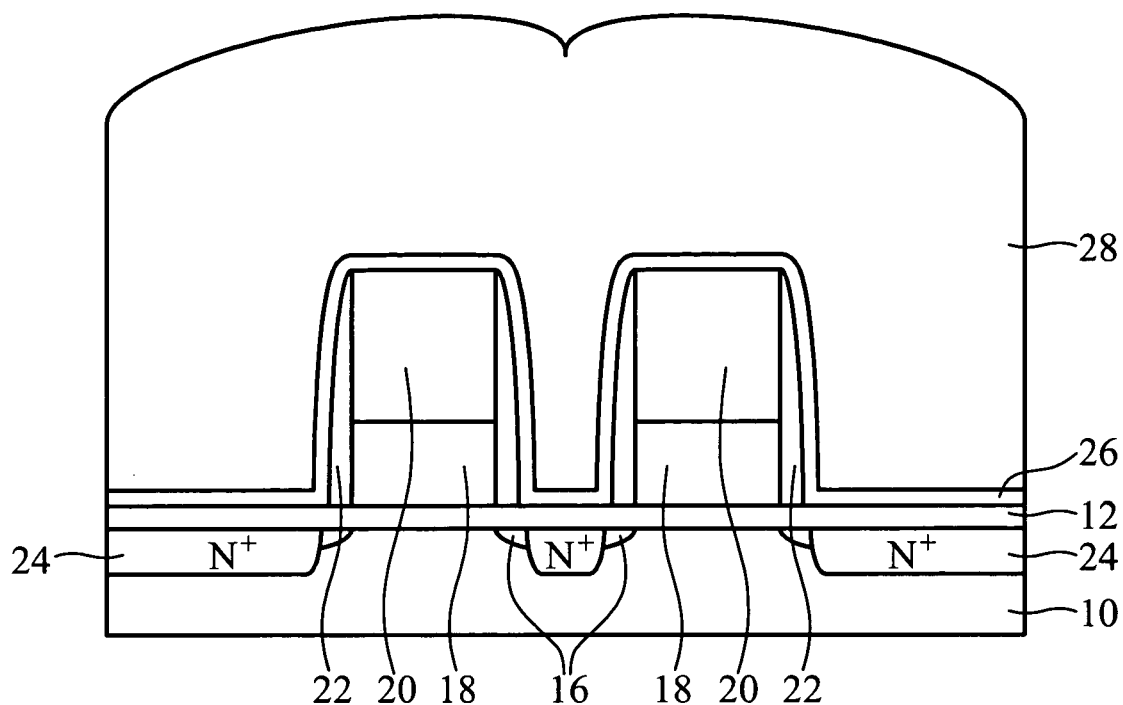
Figure 1D:
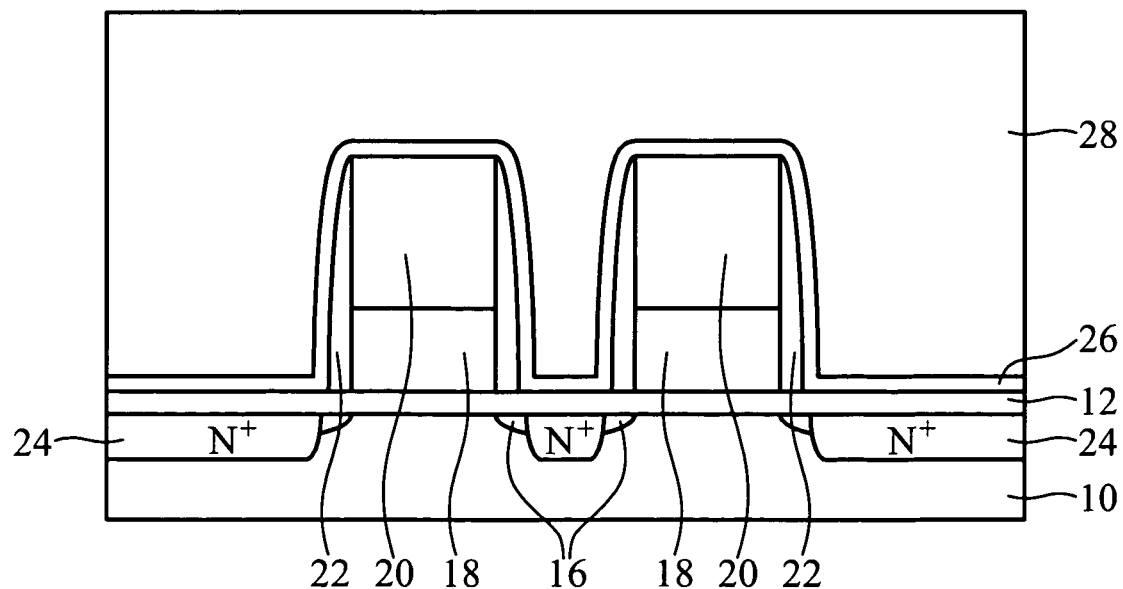
Figure 1E:
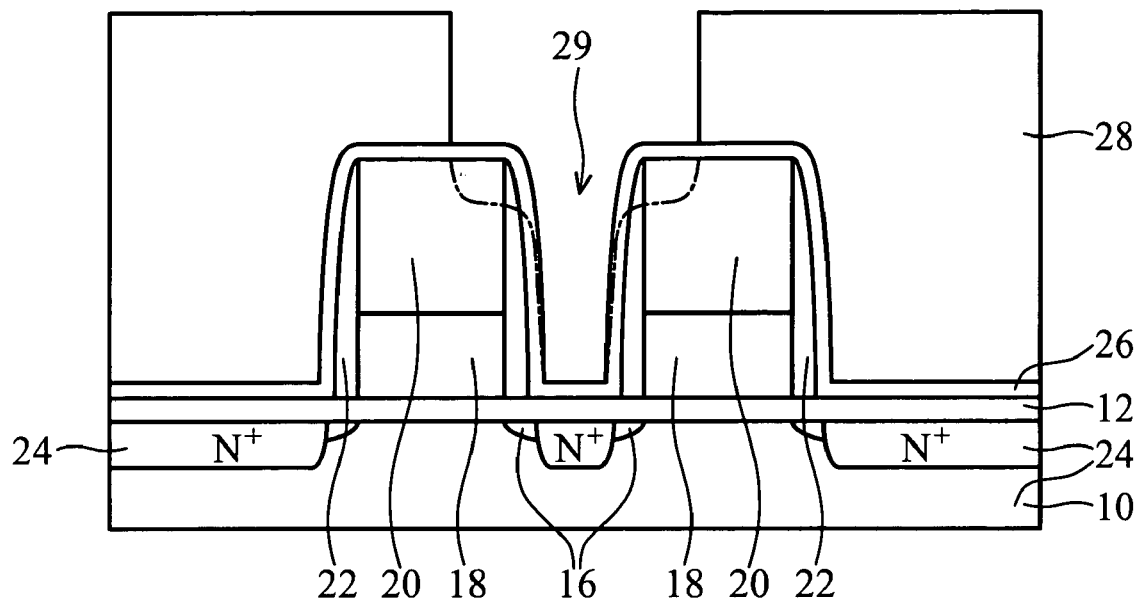
Figure 1F:
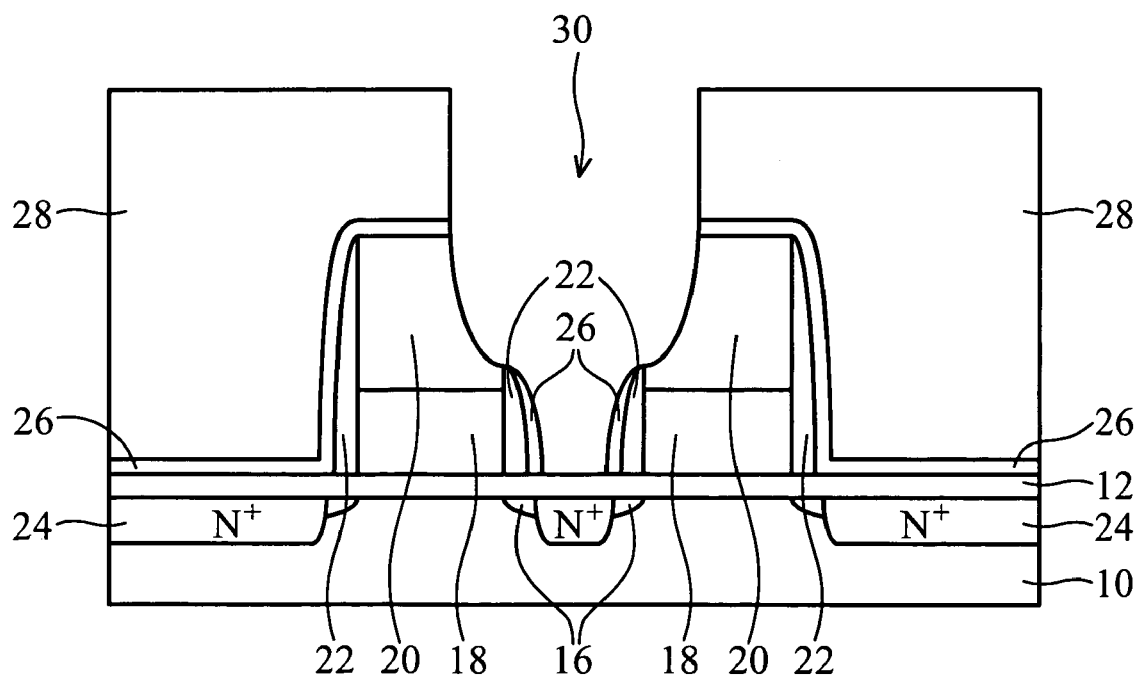
Figure 1G:
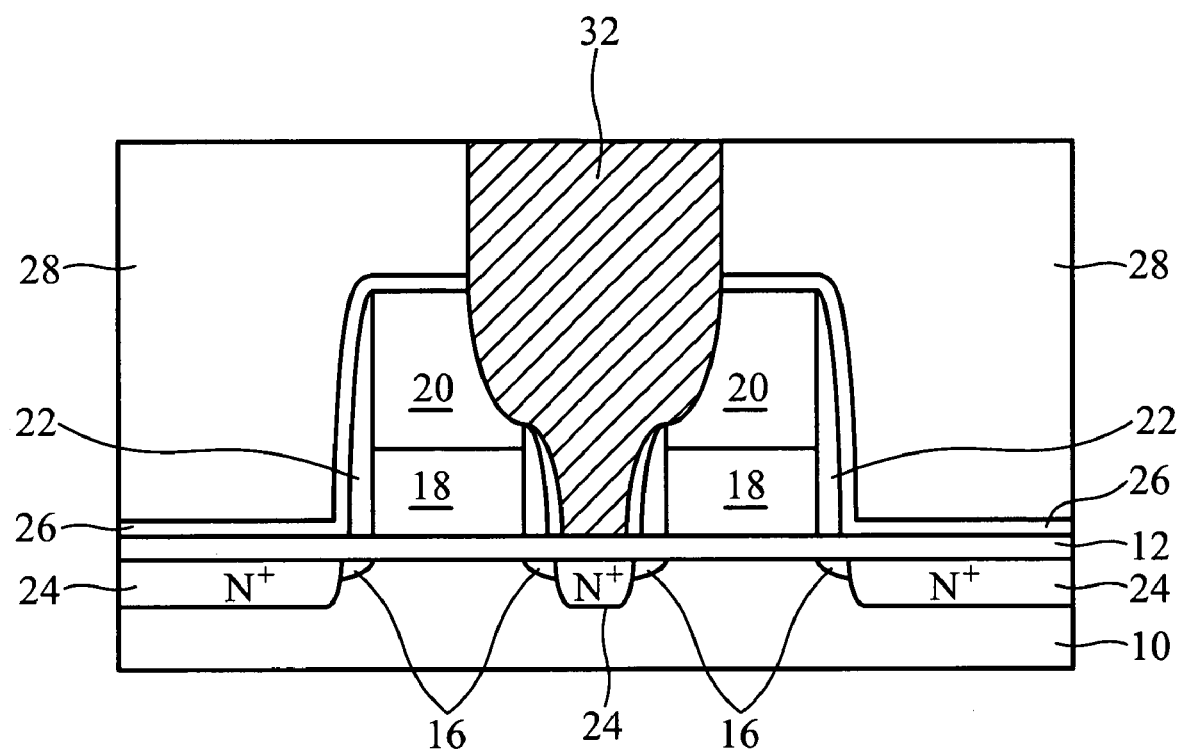
Figure 2A:
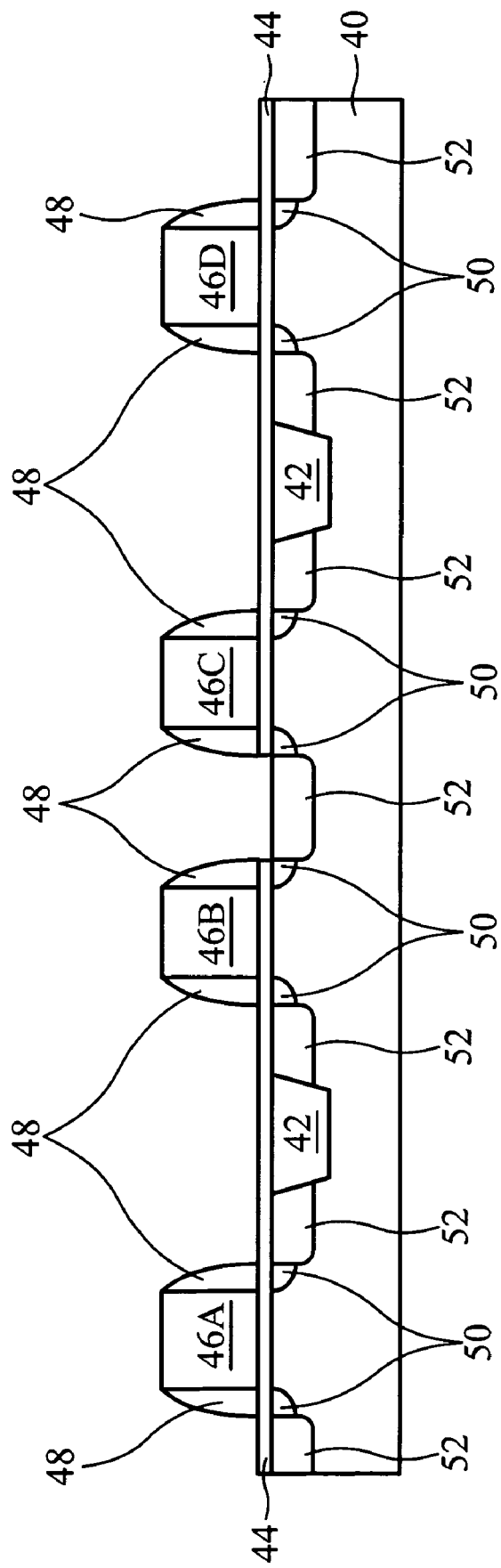
FIGS. 2A to 2K are cross-sections of a method of forming damascene bit line contact plug according to the present invention.

In FIG. 2A, a substrate 40, preferably a P-type semiconductor silicon substrate, comprises a plurality of shallow trench isolation (STI) regions 42 for isolating adjacent active areas (AA). A gate insulating layer 44 is formed on the substrate 40. A plurality of gate conductive structures 46A, 46B, 46C and 46D is formed on the gate insulating layer 44. A spacer 48 is formed on all sidewalls of the gate conductive structures 46A, 46B, 46C and 46D. A plurality of $N^-$-type ion diffusion regions 50 is formed on the substrate 40 and laterally adjacent to the gate conductive structures 46A, 46B, 46C and 46D, respectively. A plurality of $N^+$-type ion diffusion regions 52 is formed on the exposed areas of the $N^-$-type ion diffusion regions 50, respectively.

Each of the gate conductive structures 46A, 46B, 46C, and 46D preferably comprise a stack of a polysilicon layer, a tungsten silicide layer, and a cap layer. The cap layer may be SiN, SiON or silicon oxide. The spacer 48 may be SiN, SiON, silicon oxide or a combination thereof. The $N^+$-type ion diffusion region 52 serves as a source/drain region. The $N^-$-type ion diffusion region 50 serves as a lightly doped drain (LDD) structure.

Figure 2B:
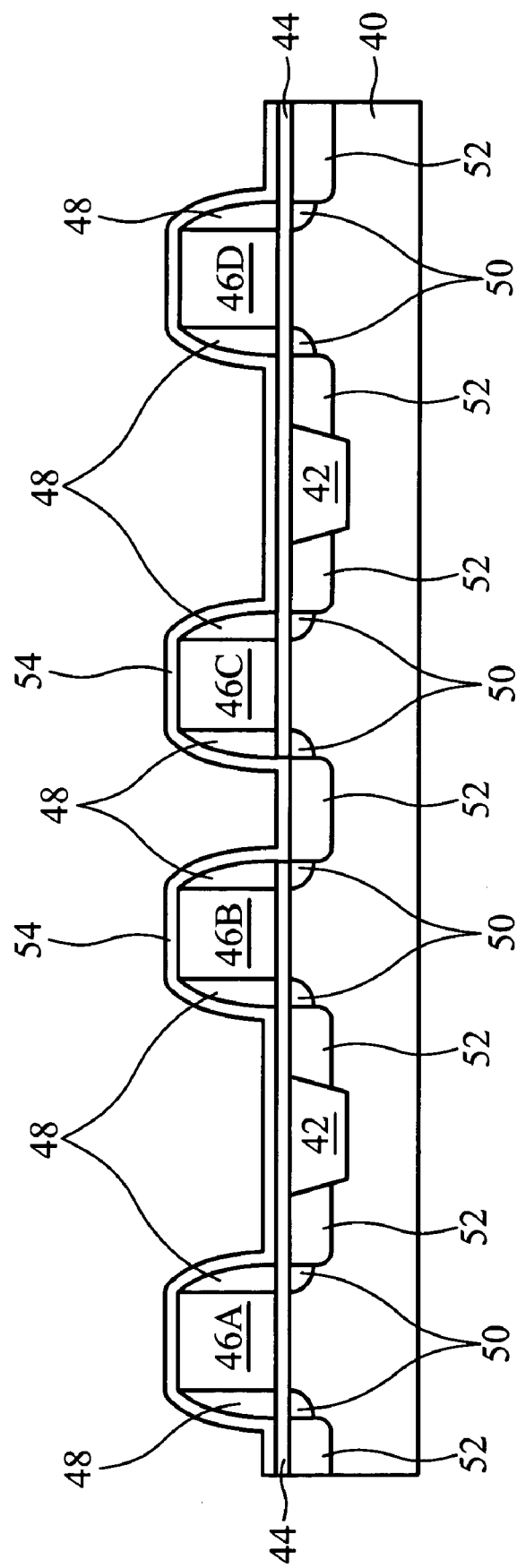

In FIG. 2B, a first liner 54 of SiN, SiON or silicon oxide is deposited over the entire surface of the substrate 40. Preferably, the first liner 54 is a silicon nitride layer of 100~120 Å in thickness, which serves as an etching stop layer in a subsequent etching process for a landing pad, and prevents problematic ion diffusion in a subsequently deposited BPSG layer.

Figure 2C:
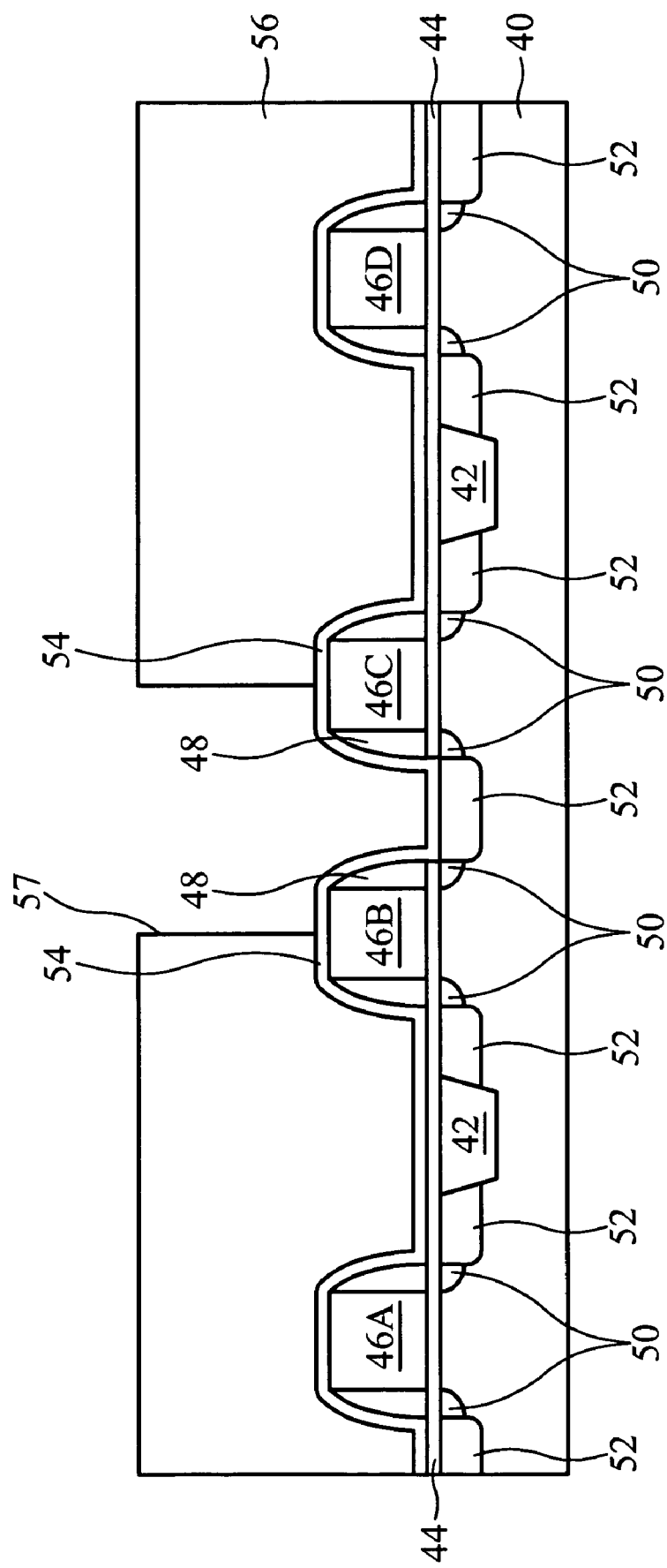
Figure 2D:
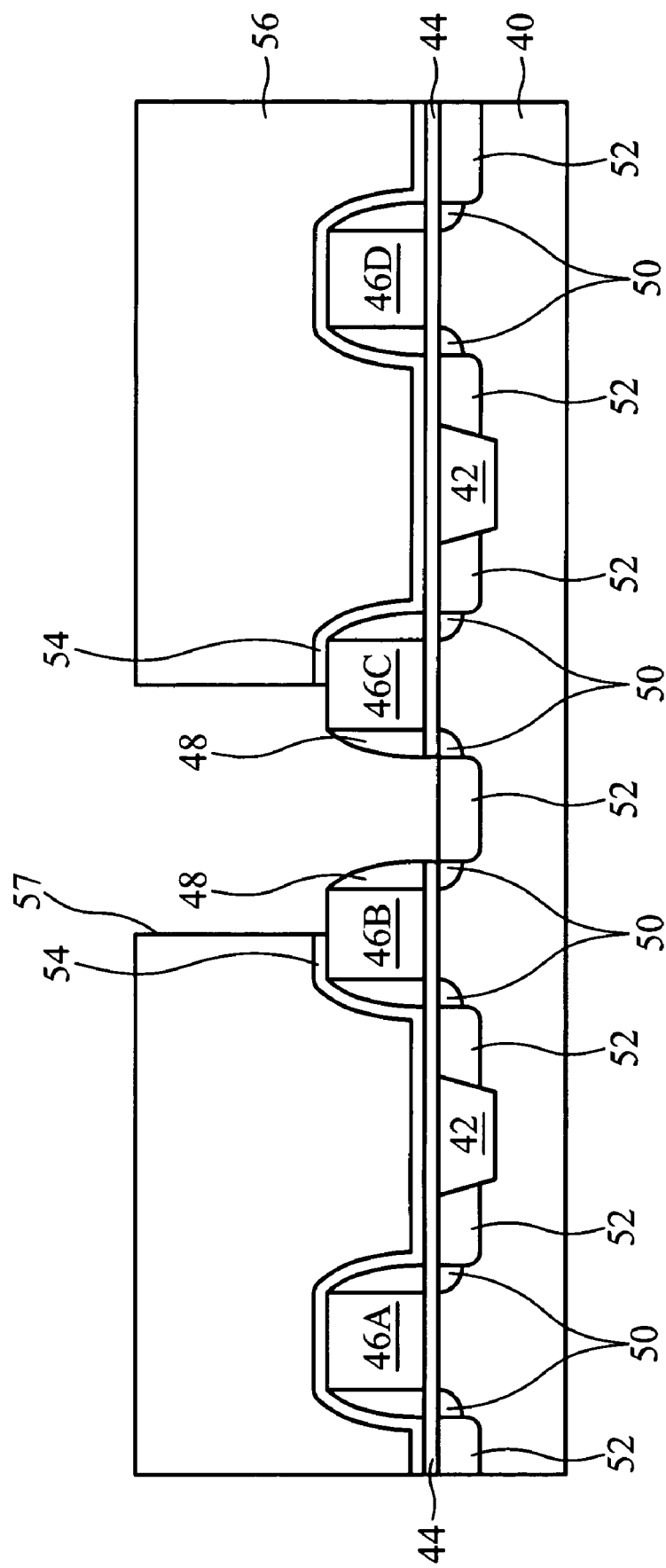

In FIG. 2C, a first photoresist layer 56 is provided with an opening 57 corresponding to a predetermined bit line contact hole. Then, in FIG. 2D, using photolithography and etching, the first liner 54 and the gate insulating layer 44 exposed within the opening 57 are removed so as to expose the $N^+$-type ion diffusion region 52 located between the two adjacent gate conductive structures 46B and 46C.

Figure 2E:
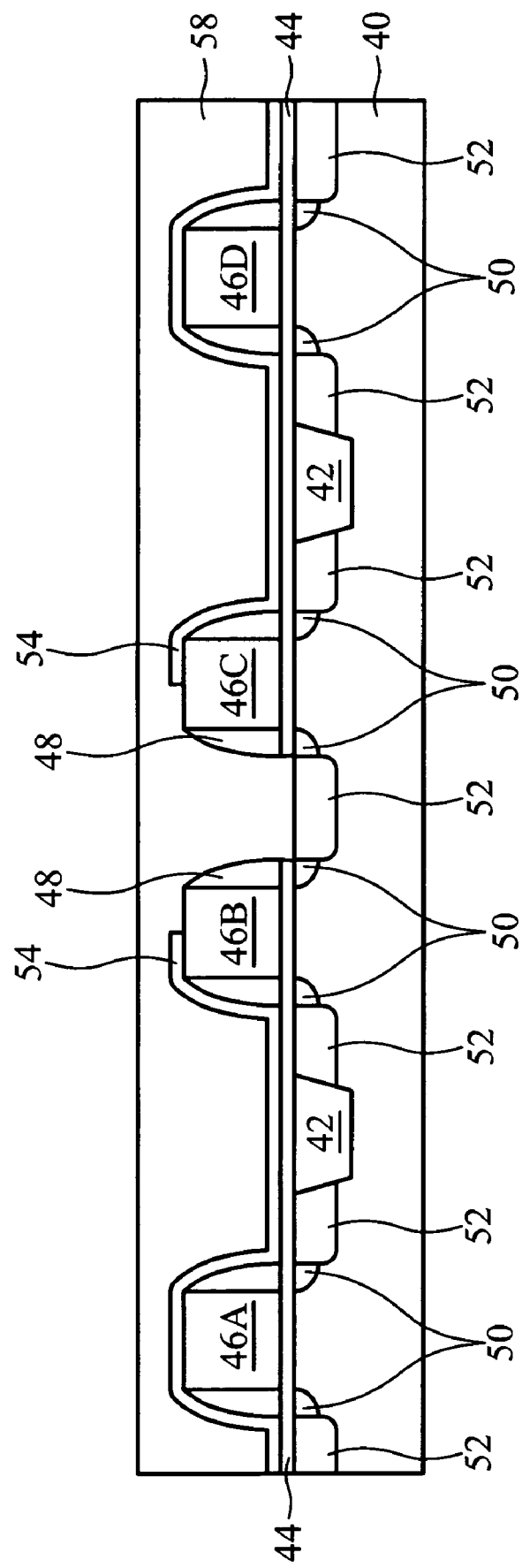

In FIG. 2E, after removing the first photoresist layer 56, a first conductive layer 58 is deposited on the substrate 40, and then a chemical mechanical polishing (CMP) process is used to planarize the first conductive layer 58 until the top of the first conductive layer 58 is slightly higher than or approximately equal to the first liner 54 positioned on top of the gate conductive structures 46A, 46B, 46C and 46D. Preferably, the first conductive layer 58 is a polysilicon layer of 3500~3000 Å in thickness.

Figure 2F:
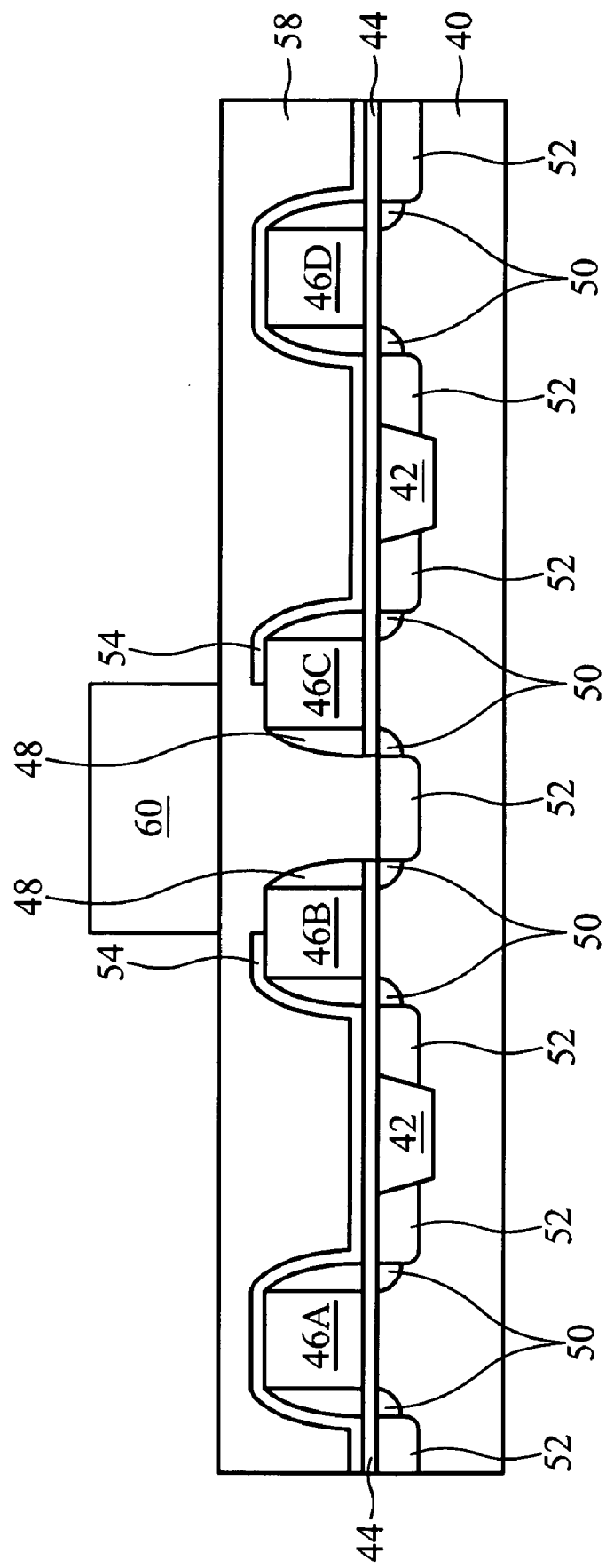
Figure 2G:
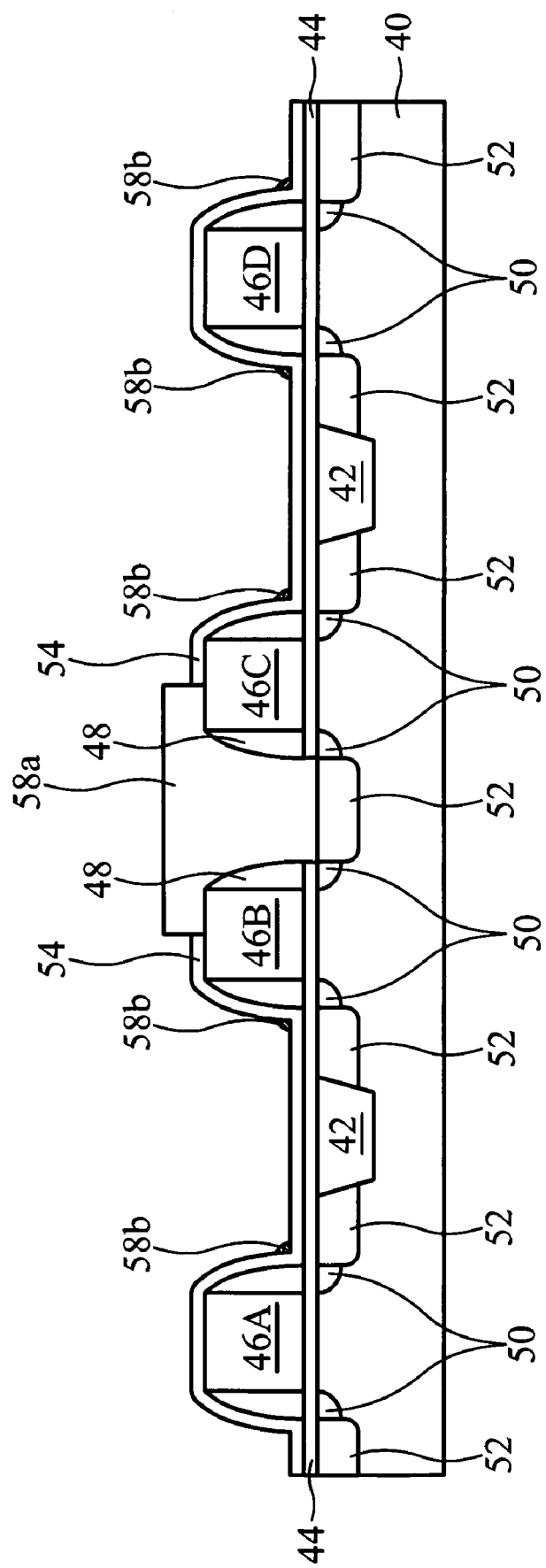

In FIG. 2F, a second photoresist layer 60 is formed on the first conductive layer 58 with a pattern corresponding to a predetermined bit line contact hole. Then, in FIG. 2G, using the second photoresist layer 60 as a mask and using the first liner 54 as an etching stop layer, the first conductive layer 58 is etched to serve as a landing pad 58a remaining between the adjacent gate conductive structures 46B and 46C. The top of the landing pad 58a is slightly higher than or approximately equal to the first liner 54 positioned on top of the gate conductive structures 46B and 46C. After removing the second photoresist layer 60, residues 58b of polysilicon or polymer are found on concave portions of the undulated surface profile, thus an additional wet etching process is performed remove the residue 58b, using for example, $NH_4OH$ as an etching solution.

Figure 2H:
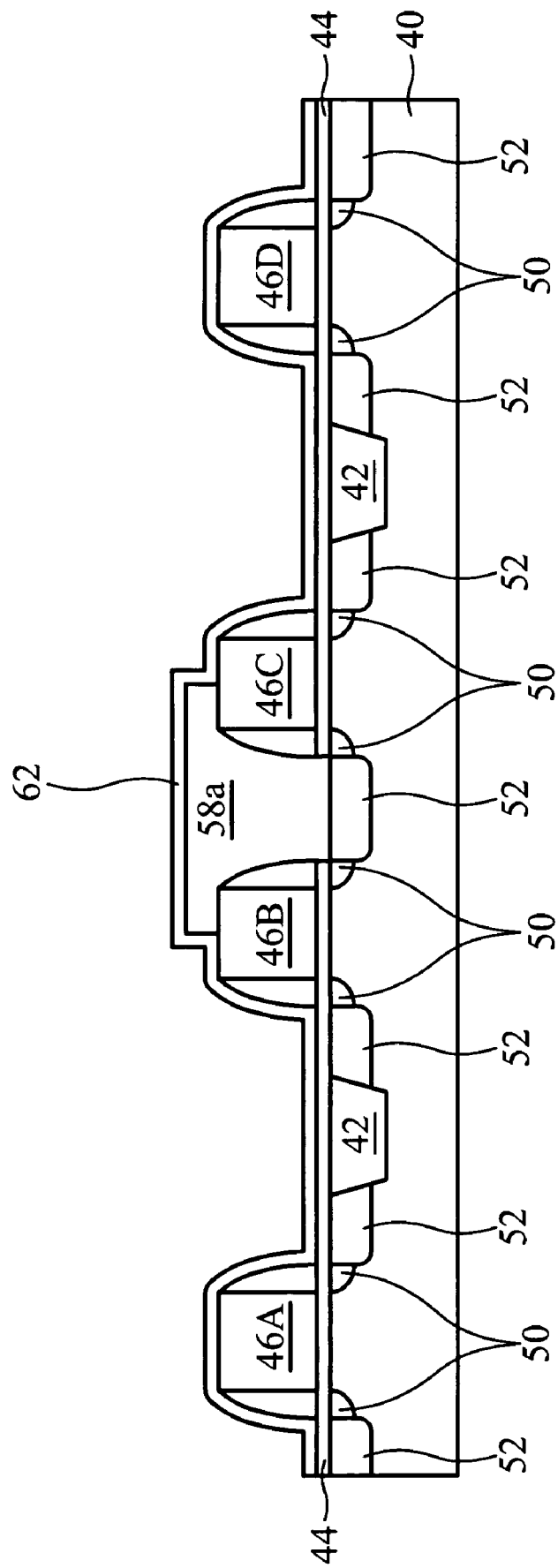

In FIG. 2H, a second liner 62 is formed on the substrate 40 to cover the top of the landing pad 58a. Preferably, the second liner 62 is a silicon nitride layer of 100~120 Å in thickness. In one approach to forming the second liner 62, the first liner 54 is removed and then a silicon nitride layer is conformally deposited on the substrate 40. In another approach to forming the second liner 62, a silicon nitride layer is immediately conformally deposited on top of the landing pad 58a. The second liner 62 serves to prevent a short circuit between two adjacent bit lines, and provide a superior etching rate in a subsequent etching process for a contact hole.

Moreover, the second liner 62 can allow a bit line contact hole, a gate contact hole and a source contact hole to be completed simultaneously. Alternatively, the second liner 62 can be omitted, thus a bit line contact hole is completed prior to the steps of forming a gate contact hole and a source contact hole.

Figure 2I:
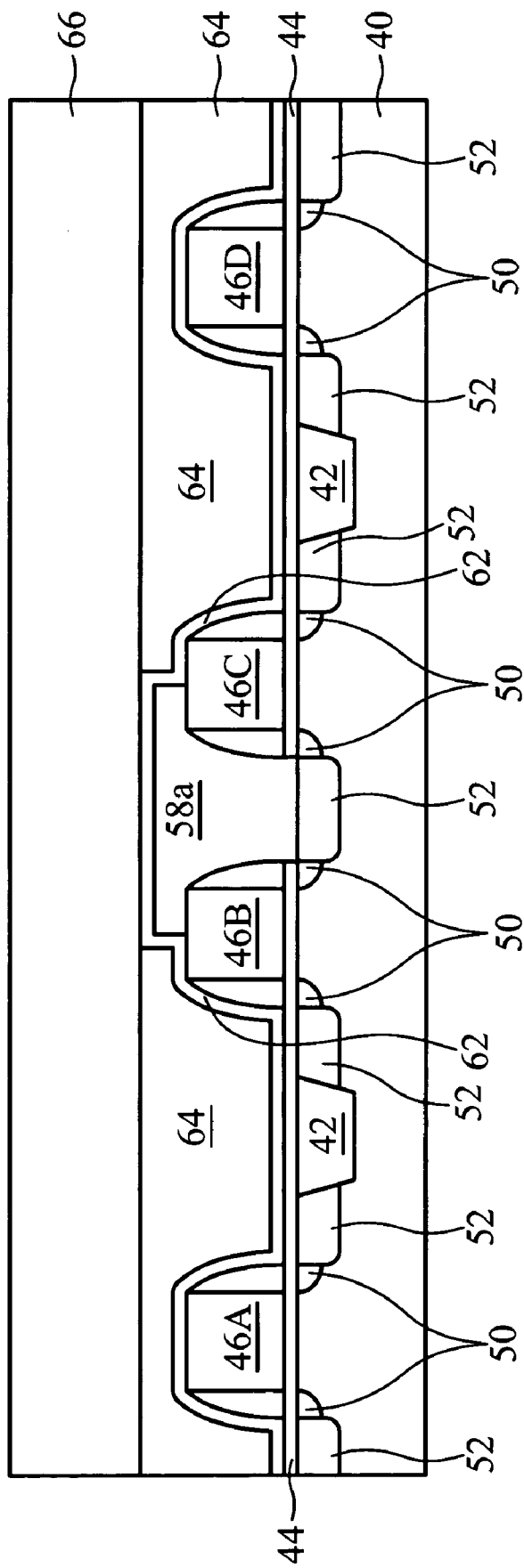

In FIG. 2I, a first inter-layer dielectric (ILD) 64 is formed on the substrate 40 to fill the gap between adjacent gate conductive structures 46A, 46B, 46C and 46D. Then, a CMP process is used to planarize the ILD 64 until the top of the ILD 64 is equal to the top of the second liner 62 positioned on top of the landing pad 58a. Next, a second ILD 66 is deposited on the first ILD 64 to achieve a planarized surface. Either the first ILD 64 or the second ILD 66 is BPSG, HDP oxide, TEOS oxide or a combination thereof. Preferably, the first ILD 64 is a BPSG layer of 3500~3000 Å in thickness, and the second ILD 66 is a TEOS oxide layer of 3000~2500 Å in thickness.

Figure 2J:
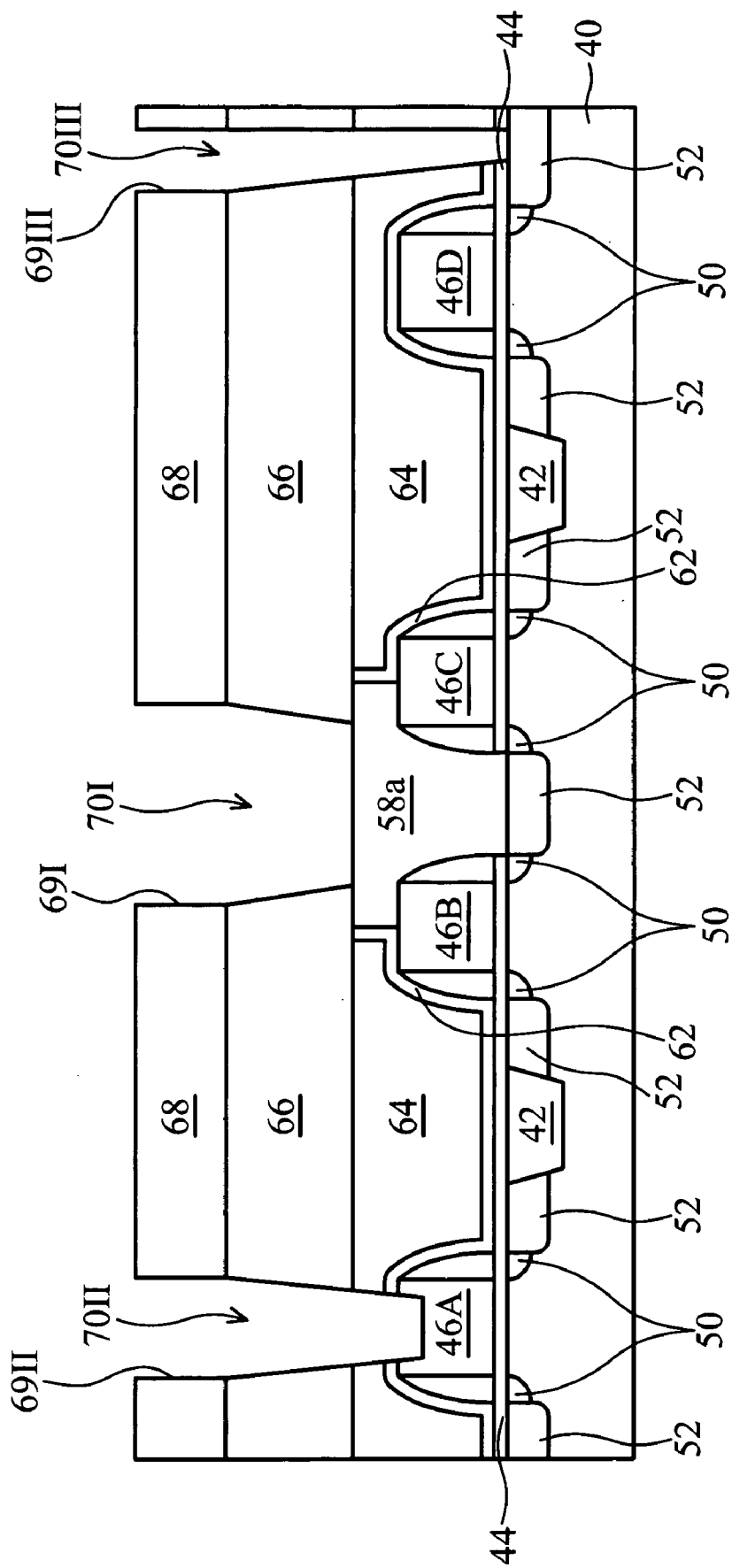

In FIG. 2J, a third photoresist layer 68 is provided with a first opening 69I corresponding to a bit line contact hole, a second opening 69II corresponding to a gate contact hole, and a third opening 69III corresponding to a source contact hole. Then, using photolithography and etching, the second ILD 66, the first ILD 64, the second liner 62 and the gate insulating layer 44 exposed under the openings 69I, 69II and 69III are removed to form a bit line contact hole 70I, a gate contact hole 70II and a source contact hole 70III. The bit line contact hole 70I exposes the landing pad 58a positioned between the two adjacent gate conductive structures 46B and 46C. The gate contact hole 70II exposes the tungsten silicide layer of the gate conductive structure 46A. The source contact hole 70III exposes the $N^+$-type ion diffusion region 52 located at one side of the gate conductive structure 46D.

Figure 2K:
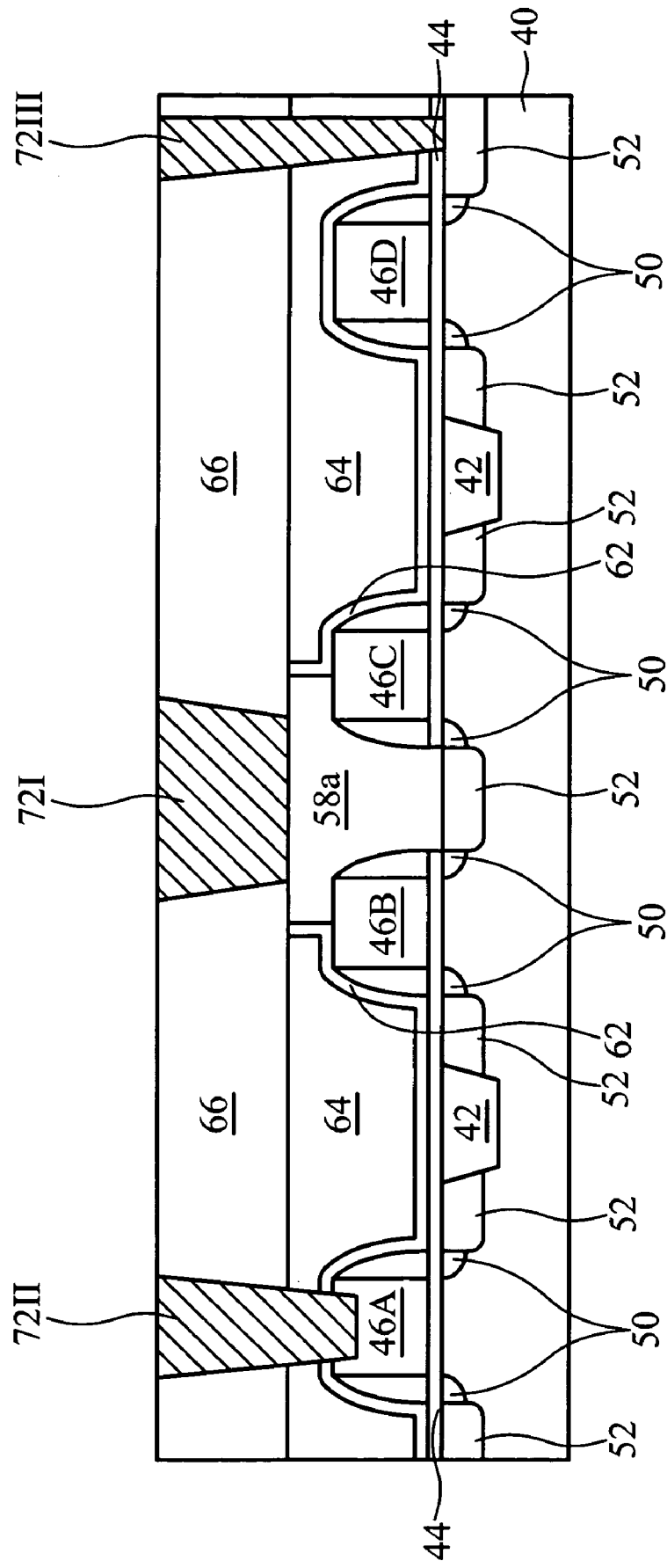

Finally, in FIG. 2K, after removing the third photoresist layer 68, a second conductive layer 72 is deposited to fill the bit line contact hole 70I, the gate contact hole 70II and the source contact hole 70III. Preferably, the second conductive layer 72 is selected from polysilicon tungsten or other conductive materials. Then, a CMP process is used to level off the surface of the second conductive layer 72 and the second ILD 66. Thus, the second conductive layer 72 remaining in the bit line contact hole 70I is electrically connected to the landing pad 58a to serve as a damascene bit line contact plug 72I. The second conductive layer 72 remaining in the gate contact hole 70II serves as a gate contact plug 72II. The second conductive layer 72 remaining in the source contact hole 70III serves as a source contact plug 72III.

Compared with the conventional SAC process, the present invention has the following advantages.

The etching selectivity of the polysilicon layer to the silicon oxide layer is large enough to provide etching stop capability during the formation of the bit line contact hole 70I, thus, the etched profile of the bit line contact hole 70I is not affected and prevents short circuits and blind window problems caused by the conventional SAC process.

In manufacturing devices of a reduced size, the present invention can be used during a contact process to achieve a line width of less than 0.11 μm without the attendant problems caused by photolithography and etching.

The second liner 62 of silicon nitride and the first ILD 64 of BPSG prevent diffusion of boron ions and phosphorous ions into the substrate 40, thus ensuring device reliability.

Last, the second liner 62 formed on top of the landing pad 58a allows the bit line contact hole 70I, the gate contact hole 70II and the source contact hole 70III to be completed simultaneously.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A fabrication method for a damascene bit line contact plug, comprising the steps of:
    providing a semiconductor substrate having a first gate conductive structure, a second gate conductive structure and a source/drain region, in which the source/drain region is formed in the substrate between the first gate conductive structure and the second gate conductive structure;
    forming a first liner on the substrate;
    forming a first conductive layer in a space between the first gate conductive structure and the second gate conductive structure, in which the first conductive layer is electrically connected to the source/drain region;
    forming a second liner on the substrate to cover a top of the first conductive layer;
    forming an inter-layer dielectric with a planarized surface overlying the substrate to cover the first conductive layer, the first gate conductive structure, and the second gate conductive structure;
    forming a bit line contact hole in the inter-layer dielectric to expose the top of the first conductive layer; and
    forming a second conductive layer in the bit line contact hole, in which the combination of the second conductive layer and the first conductive layer serves as a damascene bit line contact plug.

2. The fabrication method for a damascene bit line contact plug as claimed in claim 1, wherein the formation of the first conductive layer comprises the steps of:
    forming the first liner to cover the first gate conductive structure, the second gate conductive structure and the substrate;
    providing a first photoresist layer having an opening corresponding to the bit line contact hole;
    removing the first liner exposed within the opening to expose the source/drain region located between the first gate conductive structure and the second gate conductive structure;
    removing the first photoresist layer;
    depositing the first conductive layer to fill the space between the first gate conductive structure and the second gate conductive structure;
    performing a chemical mechanical polishing process on the first conductive layer, in which the top of the first conductive layer is higher or approximately equal to the first liner positioned on top of the first gate conductive structure and the second gate conductive structure;
    providing a second photoresist layer having a pattern corresponding to the bit line contact hole; and
    removing the first conductive layer not covered by the second photoresist layer, in which the first conductive layer remains in the space between the first gate conductive structure and the second gate conductive structure and is electrically connected to the source/drain region.

3. The fabrication method for a damascene bit line contact plug as claimed in claim 2, wherein the formation of the first conductive layer further comprises the steps of:
    removing the second photoresist layer; and
    performing a wet etching process to remove polymer residue from the substrate.

4. The fabrication method for a damascene bit line contact plug as claimed in claim 2, wherein the first liner is SiN or SiON.

5. The fabrication method for a damascene bit line contact plug as claimed in claim 2, wherein the thickness of the first liner is 100~120 Å.

6. The fabrication method for a damascene bit line contact plug as claimed in claim 1, wherein the formation of the bit line contact hole comprises the steps of:
    forming the second liner on the substrate;
    forming a first inter-layer dielectric layer on the substrate to cover the second liner;
    performing a chemical mechanical polishing process on the first inter-layer dielectric, in which the top of the first inter-layer dielectric is leveled off with the top of the second liner;
    forming a second inter-layer dielectric to cover the first inter-layer dielectric and the second liner;
    providing a third photoresist layer having an opening corresponding to the bit line contact hole; and
    removing the second inter-layer dielectric and the second liner exposed within the opening to expose the top of the first conductive layer.

7. The fabrication method for a damascene bit line contact plug as claimed in claim 6, wherein the first liner is removed before forming the second liner, thus the second liner covers the first conductive layer, the first gate conductive structure and the second gate conductive structure.

8. The fabrication method for a damascene bit line contact plug as claimed in claim 6, wherein the second liner is formed on top of the first conductive layer, thus the combination of the first liner and the second liner covers the first conductive layer, the first gate conductive structure, and the second gate conductive structure.

9. The fabrication method for a damascene bit line contact plug as claimed in claim 6, wherein the second liner is SiN or SiON.

10. The fabrication method for a damascene bit line contact plug as claimed in claim 6, wherein the thickness of the second liner is 100~120 Å.

11. The fabrication method for a damascene bit line contact plug as claimed in claim 6, wherein the first inter-layer dielectric is a BPSG layer.

12. The fabrication method for a damascene bit line contact plug as claimed in claim 6, wherein the thickness of the first inter-layer dielectric is 3500~3000 Å.

13. The fabrication method for a damascene bit line contact plug as claimed in claim 6, wherein the second inter-layer dielectric is a TEOS oxide layer.

14. The fabrication method for a damascene bit line contact plug as claimed in claim 6, wherein the thickness of the second inter-layer dielectric is 3000~2500 Å.

15. The fabrication method for a damascene bit line contact plug as claimed in claim 1, wherein the second conductive layer is tungsten, polysilicon or other conductive material.

* * * * *